United States Patent
Weissenmayer et al.

(10) Patent No.: US 12,346,071 B2
(45) Date of Patent: Jul. 1, 2025

(54) METHOD AND CONTROL UNIT FOR AUTOMATICALLY SELECTING DATA SETS FOR A METHOD FOR MACHINE LEARNING

(71) Applicant: Robert Bosch GmbH, Stuttgart (DE)

(72) Inventors: Simon Weissenmayer, Flein (DE); Daniel Stuemke, Backnang (DE)

(73) Assignee: ROBERT BOSCH GMBH, Stuttgart (DE)

( * ) Notice: Subject to any disclaimer, the term of this patent is extended or adjusted under 35 U.S.C. 154(b) by 63 days.

(21) Appl. No.: 17/768,353

(22) PCT Filed: Oct. 8, 2020

(86) PCT No.: PCT/EP2020/078224
§ 371 (c)(1),
(2) Date: Apr. 12, 2022

(87) PCT Pub. No.: WO2021/073995
PCT Pub. Date: Apr. 22, 2021

(65) Prior Publication Data
US 2024/0142916 A1    May 2, 2024

(30) Foreign Application Priority Data
Oct. 17, 2019  (DE) .................. 10 2019 216 025.5

(51) Int. Cl.
*G05B 13/02*  (2006.01)
*G01D 3/02*  (2006.01)
*G06F 3/06*  (2006.01)
(52) U.S. Cl.
CPC ......... *G05B 13/0265* (2013.01); *G01D 3/022* (2013.01); *G06F 3/0608* (2013.01); *G06F 3/0652* (2013.01)

(58) Field of Classification Search
CPC .. G05B 13/0265; G01D 3/022; G06F 3/0652; G06F 3/0608
See application file for complete search history.

(56) References Cited

U.S. PATENT DOCUMENTS 8,484,522 B2 *   7/2013  Flynn .................. G06F 11/1068
                                                        365/201
2008/0313324 A1   12/2008  Wong et al.
(Continued)

FOREIGN PATENT DOCUMENTS

| CN | 101681342 A | 3/2010 |
| CN | 107977703 A | 5/2018 |

(Continued)

OTHER PUBLICATIONS

International Search Report for PCT/EP2020/078224, Issued Dec. 18, 2020.

*Primary Examiner* — Elias Desta
(74) *Attorney, Agent, or Firm* — NORTON ROSE FULBRIGHT US LLP

(57) ABSTRACT

A method for the automated selection of data sets for a method for machine learning for detecting operating variables of a motor vehicle, in which methods, measuring signal sequences for particular operating variable ranges of the motor vehicle, are detected during the operation of the motor vehicle. In the method, the operating variable ranges are assigned memory areas, each including multiple slots, each of which is configured to store a data set containing a detected measuring signal sequence, and data sets already stored in the slots being overwritable with data sets newly detected instantaneously for the same memory area in each case. For each slot of a memory area in which a data set is stored, an estimated slot error value is formed and stored together with the measuring signal sequence. The data sets, (Continued)

whose estimated slot error value is comparatively low, are preferably overwritten.

11 Claims, 2 Drawing Sheets

(56) References Cited

U.S. PATENT DOCUMENTS

| | | | |
|---|---|---|---|
| 2009/0125753 A1* | 5/2009 | Kryka | G06F 11/1068 |
| | | | 711/170 |
| 2018/0336075 A1 | 11/2018 | Cairns | |
| 2019/0143541 A1 | 5/2019 | Nemallan | |
| 2019/0155660 A1 | 5/2019 | Mcquighan et al. | |
| 2019/0251759 A1* | 8/2019 | Lora | H04W 4/44 |
| 2020/0250901 A1 | 8/2020 | Golov | |

FOREIGN PATENT DOCUMENTS

| | | |
|---|---|---|
| DE | 102008007725 A1 | 8/2008 |
| DE | 102016219594 A1 | 4/2018 |
| WO | 2019040349 A1 | 2/2019 |

\* cited by examiner

METHOD AND CONTROL UNIT FOR AUTOMATICALLY SELECTING DATA SETS FOR A METHOD FOR MACHINE LEARNING

FIELD

The present invention relates to a method for the automated selection of data sets for a method for machine learning for detecting operating variables of a motor vehicle, in which methods, measuring signal sequences for particular operating variable ranges of the motor vehicle are detected during the operation of the motor vehicle. With regard to device aspects, the present invention relates to a control unit.

BACKGROUND INFORMATION

Data are the "fuel" for machine learning algorithms, in which a function for determining variables that are difficult to detect is modeled based on a large data base. In technical systems, signals are recorded using data loggers and stored either locally or in a decentralized memory (for example, a cloud), for subsequent further processing.

In this way, very large volumes of data accrue, which are often unable to be readily used for machine learning. In addition to data preprocessing, it is necessary for most methods of machine learning to generate training data sets, validation data sets and test data sets from the available data.

As an example, the following scenario is considered below. A computer model for machine learning is to be trained, validated and tested prior to the start-up of series production of a motor vehicle that is able to determine the water film depth on the roadway surface. The water film depth is an example, of an operating variable of a road vehicle to be detected. Input variables for the computer model are the driving speed, the ambient temperature and the sound frequency spectrum originating from the rolling noise of the tires. Measured data are collected in a series of measuring runs over several hundred hours. If the training data sets, validation data sets and test data sets are now unskillfully generated from the measured data, it may happen that the selected measuring signal sequences, for example, for wet road conditions, will randomly always indicate speeds in a particular range. The method for machine learning will learn this non-causal correlation during training. The computer model learned prior to the start-up of the series production is adopted in the control units in the subsequent series production and no longer changed. Non-causal correlations that have been learned in the pre-production phase may then lead to false results during operation of the motor vehicles later manufactured in series.

In order to avoid such scenarios, the collected data are normally precisely analyzed before they are divided into training data sets, validation data sets and test data sets. The collected data potentially encompass multiple terabytes. For reasons of practicality, not all available data, but only a subset of these data are then usually analyzed and used. In the validation and the tests of learned models, techniques such as cross validation are also used, in which such "unfavorable" distributions of the data sets are recognized.

SUMMARY

In a method according to an example embodiment of the present invention, the operating variable ranges are assigned memory areas, each including multiple slots, each of which is configured to store a data set containing a measuring signal sequence, and data sets already stored in the slots being overwritable with data sets newly detected instantaneously for the same memory area in each case. For each slot of a memory area in which a data set is stored, an estimated slot error value of the measuring signal sequence contained in this data set is formed and is stored together with the measuring signal sequence. During overwriting, those data sets are preferably overwritten whose estimated slot error value is lower than other estimated slot error values that have been formed for the same memory area. The control unit according to an example embodiment the present invention is configured to control a sequence of the method according to the present invention and to thus carry out the method according to the present invention.

In accordance with an example embodiment of the present invention, the data sets are subdivided directly during the detection into data sets to be stored and data sets not to be stored. This avoids the time-consuming analysis of potentially very large volumes of data. The storing of unnecessarily numerous redundant signal ranges that offer no additional information content is also avoided, for which reason less memory space is required. In this way the volume of data required for machine learning and also the analysis effort may be drastically reduced and computation time, memory capacity and volumes of data may be saved.

The selection of relevant measuring signal sequences according to the present invention taking place already during the storing of the measured data in the vehicle minimizes the costs that are required for the buffering of the data and the computing time for the learning in the vehicle as well as for a transfer of the data for, if necessary, calculation taking place in the cloud.

Using the data of each slot, the individual estimated slot error value of that slot is calculated during machine learning, which is equivalent to the error of the measuring signal sequence stored in the slot and of the associated data set. The greater the estimated slot error value is, the more interesting and informative and thus more valuable the data set is for later occurring iterations of the machine learning. When overwriting the slot contents with new data sets (in particular, measuring signal sequences and associated estimated slot error values), preferred data sets are therefore used, i.e., overwritten, whose estimated slot error values are lower as compared to estimated slot error values of comparable slots. Comparable slots are slots that are assigned to identical or to similar measuring signal sequences. As a result, in particular those data sets remain in the memory, whose measuring signal sequences are affected by comparatively large errors. This has advantages for machine learning, since it is possible to train more efficiently with data sets that are affected by a comparatively large error than with data sets that are affected by a comparatively small error. As a result, memory, computing time and volumes of data to be transferred during a transfer to external servers may be saved.

In one preferred embodiment of the present invention, an operating parameter of the motor vehicle is calculated from an instantaneously detected measuring signal sequence using a computer model, that the operating parameter is measured concurrently with a reference value sensor, and that the estimated slot error value is formed as a function of a deviation of the calculated operating parameter from the measured operating parameter.

In one further preferred embodiment of the present invention, the computer model is a computer model to be trained by the method for machine learning.

It is also preferred that only those data sets are released for overwriting, for which an estimated slot error value has already been calculated during the machine learning.

It is further preferred that when all slot contents already released for overwriting have been overwritten, the next data set to be overwritten anew is selected according to a random principle before a machine learning process could start.

The random, repeated overwriting may mean that not only the most up-to-date data, but also in part much older data are available for the training. As a result, the probability is greater that new data that are particularly interesting are available in the memory.

It is further preferred that in a driving cycle of the motor vehicle, only one predetermined portion of the data set, for which an estimated slot error value has already been calculated during the machine learning, is released for overwriting.

In one further preferred embodiment of the present invention, data sets are transferred to a memory located outside of the motor vehicle.

It is further preferred that the data sets stored in the motor vehicle are sorted in descending order according to their estimated slot error value, and that the transfer takes place in this sorting sequence and starts with the measuring signal sequence that has the highest estimated slot error value.

In this way, the most interesting data sets are always available to the server and to other vehicles for their learning algorithms, as a result of which the memory requirement and the computing time for learning as opposed to a random selection of measured data may be drastically reduced.

Ideally, data sets of specific driving maneuvers or of reference drives are also stored in the vehicle in advance, which are not able to be overwritten and which are used for validating the machine learning. This may ensure that the model maintains the required robustness, even if the result of each individual learning process is not supervised by a human.

A computer program according to the present invention includes computer-readable instructions, upon execution of which on a computer, a method according to one of the aforementioned methods is run. A computer program according to the present invention is characterized by a machine-readable memory medium, on which the computer program is stored.

Example embodiments of control units according to the present invention are configured to control a sequence of one of the aforementioned methods and thus to carry out the method.

BRIEF DESCRIPTION OF THE DRAWINGS

Further advantages result from the following description and the figures. It is understood that the features cited above and those to be explained below are applicable not only in each specified combination, but also alone, without departing from the scope of the present invention.

Exemplary embodiments of the present invention are represented in the figures and are explained in greater detail in the following description.

DETAILED DESCRIPTION OF EXAMPLE EMBODIMENTS

Figure 1:
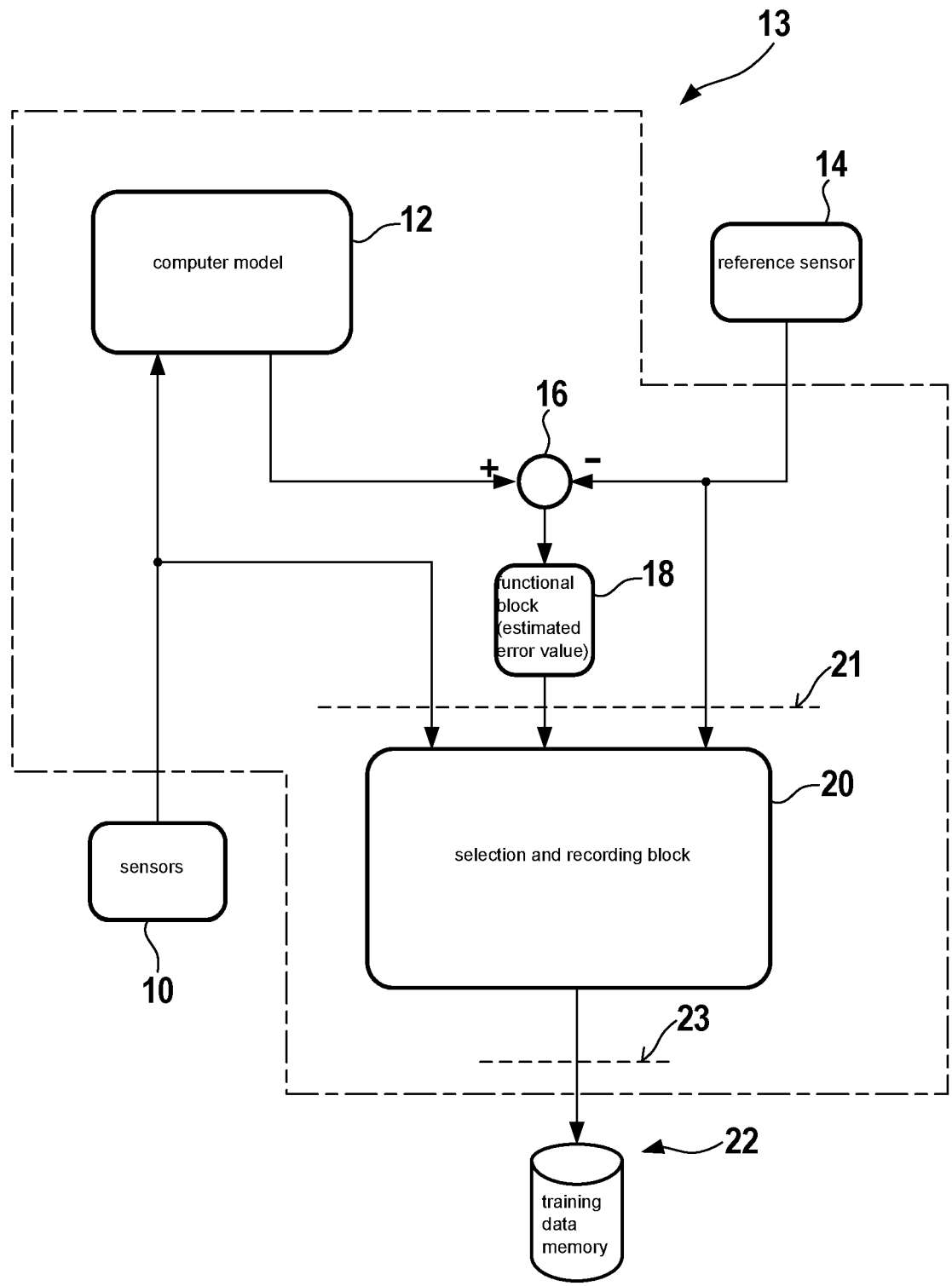
FIG. 1 schematically shows a functional block diagram including method aspects and device aspects of one exemplary embodiment of the present invention.

FIG. 1 shows a block 10, which represents an ensemble of different sensors of a motor vehicle. The ensemble in one exemplary embodiment includes an ambient temperature sensor, a sensor detecting the vehicle speed, and a sensor detecting the sound frequency spectrum originating from the rolling noise of the tires. The ensemble may also include further and/or other sensors that detect operating parameters of the motor vehicle.

An operating parameter of the motor vehicle is calculated in a computer model 12 from measuring signal sequences detected by these sensors. The operating parameter is, for example, an operating parameter that is difficult, time-consuming or costly to measure, such as the depth of a water film on a wet roadway. The calculations of the computer model are carried out in a control unit 13 of the motor vehicle. The calculations are carried out preferably in two operating modes of the computer model.

In a first operating mode, computer model 12 is operated as a base computer model, in which the operating parameter is calculated with a simplified calculation and thus with limited accuracy. This calculation takes place during the driving operation on the basis of the detected operating variables. Computer model 12 is preferably a component of a control unit 13 of the motor vehicle, for example, in the form of a program, which is stored in a memory of control unit 13 and is executed by a processor of control unit 13. This applies similarly to the further functional blocks of the control unit which, in this regard, represent both device aspects as well as method aspects.

In a second operating mode, which is active when the vehicle is at a standstill, the computer model is trained using the data sets stored in the preceding first operating mode.

In a data acquisition phase, the operating parameter is measured by a reference sensor 14 in parallel to its calculation. In the example of the water film, this may involve an expensive laser sensor. The reference sensor is potentially used only in the data acquisition phase and is not present in the motor vehicles later manufactured in series. The data acquisition phase is a phase in which data are collected using one or using comparatively few test vehicles, for example, pre-series vehicles. Computer models which, in the trained state, are used, later for a larger number of vehicles, for example, after a start-up of a series production of the vehicles, are trained using the collected data.

In a differential formation block 16 of control unit 13, a difference is calculated between the operating parameters calculated in base computer model 12 and concurrently measured using reference sensor 14. In a subsequent functional block 18 of control unit 13, the difference is squared in order to generate a positive value. Instead of squaring, the absolute value of the difference could also be formed.

This difference or its square or absolute value is considered in this application to be an estimated error value, by which measuring signal sequences are affected, from which the operating parameter has been calculated using the base computer model 12.

In a selection and recording block 20, a selection of the measuring signal sequences detected by sensors 10 of the motor vehicle and/or data sets containing measuring signal sequences from the sensors takes place. For this purpose, the measuring signal sequences detected by sensors 12 of the motor vehicle, the estimated slot error values and, if necessary, also the respectively associated values of reference sensor 14 are fed to recording block 20. The selection takes place in control unit 13 of the motor vehicle, so that recording block 20 also represents both method aspects and device aspects.

The selected data are stored in a training data memory 22 as new training data and used temporally separately from the acquisition phase for the training of a trainable computer model for the operating parameter (for example, water film depth). Training data memory 22 may be a memory of the control unit of the motor vehicle. Alternatively, memory 22 may also be a decentralized memory (for example, cloud), which is located outside the motor vehicle, and in which training data selected according to the present invention may be stored, which originate from multiple vehicles. The data exchange may, for example, take place via a mobile radio connection.

The trainable computer model may be the previously mentioned base computer model, which is then operated in a training phase.

Figure 2:
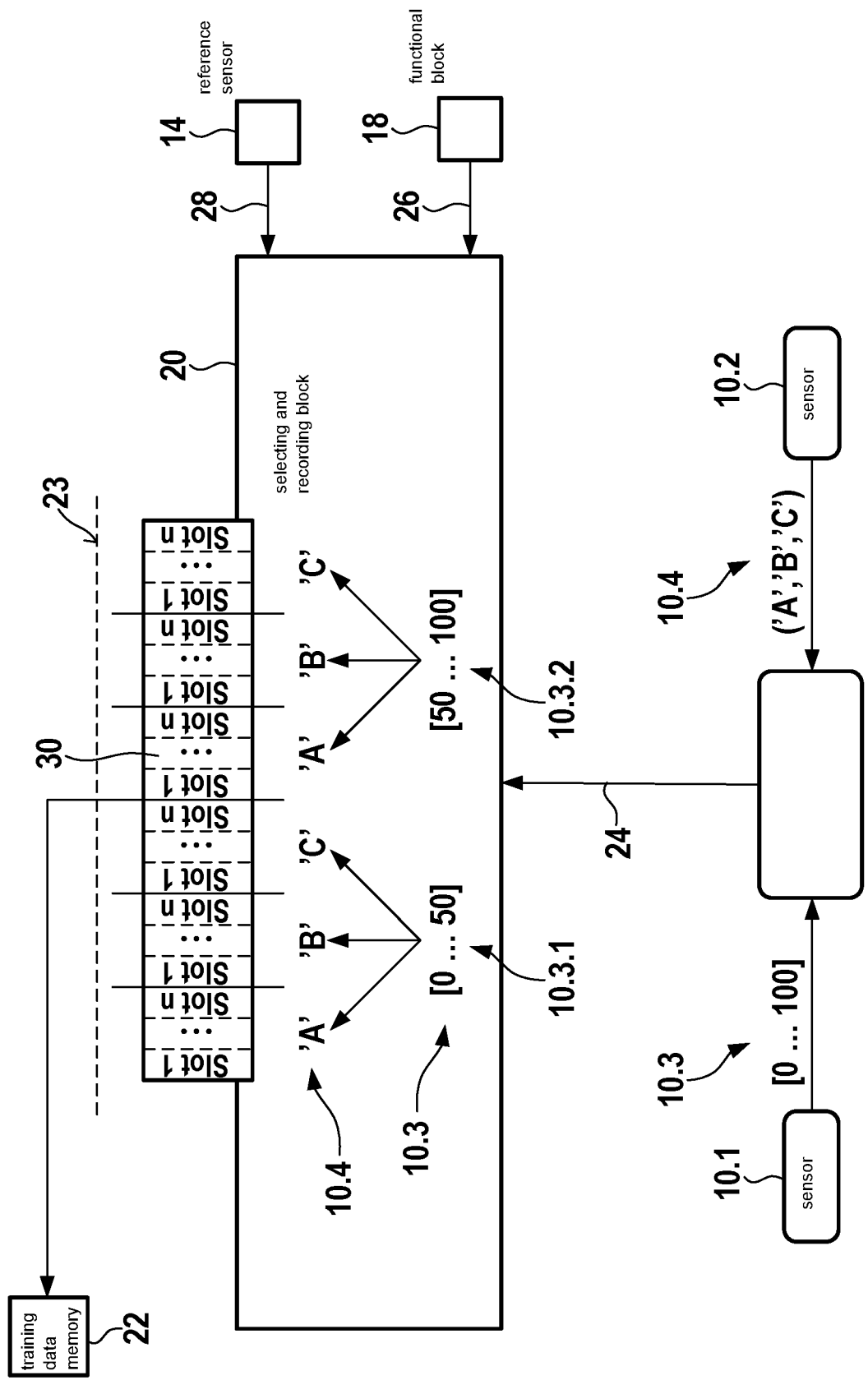
FIG. 2 schematically shows an exemplary embodiment of a selection of measuring signal sequences including features of the present invention as they may occur in the recording block of FIG. 1.

FIG. 2 illustrates an exemplary embodiment of a selection of measuring signal sequences including features of the present invention, as they may occur in recording block 20 of FIG. 1. Recording block 20 is situated with regard to its input signals and its output signals between a recording interface 21 and a data memory interface 23. The measuring signal sequences of sensors 10, the estimated error values of block 18 and the signals of reference sensor 14 are fed to the recording block via recording interface 21. Recording interface 21 represents a data logger for these data. Data memory interface 23 represents, for example, an interface to the training data memory situated within the motor vehicle, in particular, within a control unit 13 of the motor vehicle executing the computer model. Alternatively or in addition, data memory interface 23 is a link to a server-side data base in the cloud.

In the example represented in FIG. 2, measuring signal sequences from two sensors 10.1, 10.2 are fed to selection and recording block 20 via path 24, estimated error values via path 26 and measured values of reference sensor 14 via path 28.

A first sensor 10.1, for example, has a value range 10.3 of 0 through 100, and a second sensor 10.2, for example, has a value range 10.4 including three discrete values A, B, C.

Value range 10.3 of first sensor 10.1 is divided into operating variable ranges 10.3.1, which corresponds to an interval [0 to 50], and 10.3.2, which corresponds to an interval [50 to 100].

Value range 10.4 of second sensor 10.2 is divided into operating variable ranges A, B, C. This results in 6 possible combinations in the example shown. For each possible combination from operating variable ranges 10.3.1, 10.3.2 of first sensor 10.1 and from operating variable ranges A, B, C of second sensor 10.2, there are n slots 30 available in the memory. The number n of slots is, for example, a number between 10 and 100.

In the pre-configured slots, one measuring signal sequence each of sensors 10.1, 10.2 is stored per slot, together with an associated estimated error value and optionally also together with the associated reference value.

The mechanism with the slots is used primarily to collect preferably heterogeneous and diverse data (i.e., for example, not just data from a single narrow speed range).

If now during a data acquisition phase for a combination of categories, the free slots run out as a result of a gradual occupation, it is decided based on the estimated error values of the measured error sequences already stored for this combination, which already occupied slot may be overwritten. A low estimated error value means that the computer model was already able to easily process the stored measuring signal sequence. For this reason, these measuring signal sequences are less interesting and may be overwritten with new measuring signal sequences that have higher estimated slot error values. In contrast, sequences having a high assigned estimated slot error value should be maintained (i.e., not overwritten), so that the computer model is later able to be retrained using these new pieces of information.

This selection of data (measuring signal sequences, estimated slot error values, reference value sensor values) taking place directly during the recording in data to be stored and data to be overwritten avoids a time-consuming analysis of potentially very large volumes of data. In addition, the storage of unnecessary numerous, redundant measuring signal sequences, which provide no additional information content, is avoided, for which reason less memory space is required.

Thus, the volume of data required for machine learning and also the analysis effort may be drastically reduced and computing time and memory capacity may be saved. When transferring the selected data between an external memory and motor vehicle control units, the volume of data to be transferred, if necessary, via a mobile radio connection compared to a volume of data that would have to be transferred without such a selection, may be drastically reduced.

In all exemplary embodiments, the training does not take place concurrently with the data detection. The execution of the computer model in the first operating mode taking place during the data detection is used to assess whether or not the detected data already largely correspond to the data detected with the reference sensor and to store these in the latter case. After a data detection session (for example, a test drive), the computer model is then retrained using the detected data.

Computer model 16 may also be executed on an external server, detached from the control unit of the motor vehicle. This has the advantage that many identically constructed vehicles are able to collect data simultaneously for the same computer model. In this case, the storing and overwriting takes place on the external server. The vehicle provides the server only the real-time data of operating variables, and measured values of the reference sensor.

What is claimed is:

1. A method for automated selection of data sets for a method for machine learning for detecting operating variables of a motor vehicle, the method for the automated selection comprising the following steps:
   detecting, during operation of the motor vehicle, measuring signal sequences for a plurality of operating variable ranges of the motor vehicle;
   assigning the operating variable ranges memory areas, each including multiple slots which are each configured to store a data set containing a detected measuring signal sequence of the detected measuring signal sequences, wherein data sets already stored in the slots are overwritable with data sets newly detected instantaneously for the same memory area; and
   forming an estimated slot error value of the detected measuring signal sequence for each of the slots of each memory area in which a data set is stored, and storing the estimated slot error value together with the detected measuring signal sequence;
   wherein, those of the data sets whose estimated slot error values are lower than further estimated slot error values that have been formed for the same memory area are overwritten.

2. The method as recited in claim 1, wherein an operating parameter of the motor vehicle is calculated from an instantaneously detected measuring signal sequence using a computer model, the operating parameter being measured concurrently using a reference value sensor, and the estimated slot error value is formed as a function of a deviation of the calculated operating parameter from the measured operating parameter.

3. The method as recited in claim 2, wherein the computer model is a computer model to be trained by the machine learning.

4. The method as recited in claim 2, wherein only those data sets are released for overwriting for which an estimated slot error value has already been calculated during the machine learning.

5. The method as recited in claim 4, wherein in a driving cycle of the motor vehicle, only one predetermined portion of the data sets, for which an estimated slot error value has already been calculating during the machine learning, are released for overwriting.

6. The method as recited in claim 5, wherein, when all data sets released for overwriting have already been overwritten, the next data set, which is again to be overwritten, is selected according to a random principle before a machine learning process could starts.

7. The method as recited in claim 5, wherein the data sets are transferred to a memory located outside the motor vehicle.

8. The method as recited in claim 7, wherein the data sets stored in the motor vehicle are sorted in descending order according to their estimated slot error value and the transfer takes place in the sorting sequence and starting with the data set that has a highest estimated slot error value.

9. A non-transitory machine-readable memory medium on which is stored a computer program including computer-readable instructions for automated selection of data sets for a machine learning for detecting operating variables of a motor vehicle, the instructions, when executed by a computer, causing the computer to perform the following steps:

detecting, during operation of the motor vehicle, measuring signal sequences for a plurality of operating variable ranges of the motor vehicle;

assigning the operating variable ranges memory areas, each including multiple slots configured to store a data set containing a detected measuring signal sequence of the detected measuring signal sequences, wherein data sets already stored in the slots are overwritable with data sets newly detected instantaneously for the same memory area;

forming an estimated slot error value of the measuring signal sequence for each of the slots of each memory area in which a data set is stored, and storing the estimated slot error value together with the measuring signal sequence;

wherein, those of the data sets whose estimated slot error values are lower than further estimated slot error values that have been formed for the same memory area are overwritten.

10. A control unit of a motor vehicle which is configured to automatically select data sets for a machine learning for detecting operating variables of a motor vehicle, the control unit being configured to:

detect, during operation of the motor vehicle, measuring signal sequences for a plurality of operating variable ranges of the motor vehicle;

assign the operating variable ranges memory areas, each including multiple slots configured to store a data set containing a detected measuring signal sequence of the detected measuring signal sequences, wherein data sets already stored in the slots are overwritable with data sets newly detected instantaneously for the same memory area;

form an estimated slot error value of the detected measuring signal sequence for each of the slots of each memory area in which a data set is stored, and store the estimated slot error value together with the detected measuring signal sequence;

wherein, those of the data sets whose estimated slot error values are lower than further estimated slot error values that have been formed for the same memory area are overwritten.

11. The control unit as recited in claim 10, wherein an operating parameter of the motor vehicle is calculated from an instantaneously detected measuring signal sequence using a computer model, the operating parameter being measured concurrently using a reference value sensor, and the estimated slot error value is formed as a function of a deviation of the calculated operating parameter from the measured operating parameter.

\* \* \* \* \*